US010347674B2

(12) United States Patent
Kuwazawa et al.

(10) Patent No.: US 10,347,674 B2
(45) Date of Patent: Jul. 9, 2019

(54) SOLID-STATE IMAGE CAPTURING DEVICE AND ELECTRONIC APPARATUS

(71) Applicant: SEIKO EPSON CORPORATION, Tokyo (JP)

(72) Inventors: Kazunobu Kuwazawa, Sakata (JP); Noriyuki Nakamura, Sakata (JP); Mitsuo Sekisawa, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/710,293

(22) Filed: Sep. 20, 2017

(65) Prior Publication Data

US 2018/0083055 A1 Mar. 22, 2018

(30) Foreign Application Priority Data

Sep. 20, 2016 (JP) ................. 2016-182518

(51) Int. Cl.
*H01L 27/146* (2006.01)
*H04N 5/335* (2011.01)
*H04N 5/3745* (2011.01)
*H04N 5/369* (2011.01)

(52) U.S. Cl.
CPC ....... *H01L 27/14616* (2013.01); *H04N 5/335* (2013.01); *H04N 5/379* (2018.08); *H04N 5/37457* (2013.01); *H04N 5/37452* (2013.01)

(58) Field of Classification Search
None
See application file for complete search history.

(56) References Cited

U.S. PATENT DOCUMENTS

2016/0013224 A1* 1/2016 Kuwabara ......... H01L 27/14607
257/292

FOREIGN PATENT DOCUMENTS

JP 2008-103647 A 5/2008
JP 2016-184848 A 10/2016

* cited by examiner

*Primary Examiner* — Long Pham
(74) *Attorney, Agent, or Firm* — Oliff PLC

(57) ABSTRACT

This solid-state image capturing device includes a light receiving element, a charge holding region, and a floating diffusion region that are arranged in a semiconductor substrate, and the light receiving element, a first transfer gate, and a second transfer gate in the semiconductor substrate, and is configured to have a potential gradient in the charge holding region such that signal charges that have been transferred from the light receiving element to the charge holding region by the first transfer gate are distributed more on the second transfer gate side than on the first transfer gate side.

19 Claims, 10 Drawing Sheets

SOLID-STATE IMAGE CAPTURING DEVICE AND ELECTRONIC APPARATUS

BACKGROUND

1. Technical Field

Embodiments of the present invention relates to solid-state image capturing devices, electronic apparatuses using the same, and the like.

2. Related Art

In the past, it has been mainstream to use CCDs as solid state imaging element, but in recent years, significant development has been made on CMOS sensors that can be driven at a low voltage and on which peripheral circuits can be mounted. As a result of taking measures in a manufacturing process such as a employing complete transfer technique and a dark current prevention structure and measures against noise in circuit techniques such as CDS (correlated double sampling), CMOS sensors have been improved and grown into devices surpassing that of CCDs in terms of both quality and quantity. Such significant advancement of CMOS sensors has been made possible by a significant improvement in image quality, and an improvement in charge transfer technique is one factor of this improvement.

As a related technique, a solid-state image capturing device in which a plurality of semiconductor elements that can realize complete transfer of signal charges are arranged as pixels and that has a high spatial resolution is disclosed in JP-A-2008-103647 (Paragraphs 0006-0007, FIGS. 2 and 3). The semiconductor element includes a first conductivity type semiconductor region, a second conductivity type light receiving surface buried region that is buried in an upper portion of the semiconductor region and on which light is incident, a second conductivity type charge accumulation region that is buried in an upper portion of the semiconductor region and accumulates signal charges generated by the light receiving surface buried region, a charge read-out region that receives signal charges accumulated in the charge accumulation region, a first potential control means that transfers signal charges from the light receiving surface buried region to the charge accumulation region, and a second potential control means that transfers signal charges from the charge accumulation region to the charge read-out region.

A plan layout including a light receiving surface buried region (light receiving cathode region) 11a on which light is incident, a charge accumulation region 12a that accumulates signal charges generated in the light receiving cathode region 11a, and a charge read-out region 13 that receives signal charges accumulated in the charge accumulation region 12a is shown in FIG. 2 in JP-A-2008-103647.

As shown in FIG. 2 in JP-A-2008-103647, the width of the charge accumulation region 12a on the read-out gate electrode 32 side is smaller than the width on the transfer gate electrode 31 side. However, in the case where the charge accumulation region 12a has such a shape, charges may not be fully transferred when signal charges are transferred from the charge accumulation region 12a to the charge read-out region 13 by the read-out gate electrode 32.

SUMMARY

Some aspects of the invention relates to, in a solid-state image capturing device including a light receiving element, a charge holding region, and a floating diffusion region that are arranged in a semiconductor substrate, reducing the amount of charges that are not transferred when signal charges that have been transferred from the light receiving element to the charge holding region are transferred to the floating diffusion region. Furthermore, some aspects of the invention relates to providing an electronic apparatus and the like using such a solid-state image capturing device.

A solid-state image capturing device according to a first aspect of the invention includes: a light receiving element, a charge holding region, and a floating diffusion region that are arranged in a semiconductor substrate; a first transfer gate including a gate electrode that is arranged on a region between the light receiving element and the charge holding region in the semiconductor substrate via a gate insulating film; and a second transfer gate including a gate electrode that is arranged on a region between the charge holding region and the floating diffusion region in the semiconductor substrate via a gate insulating film. The solid-state image capturing device is configured to have a potential gradient in the charge holding region such that signal charges that have been transferred from the light receiving element to the charge holding region by the first transfer gate are distributed more on the second transfer gate side than on the first transfer gate side.

According to the first aspect of the invention, signal charges that have been transferred from the light receiving element to the charge holding region by the first transfer gate are distributed more on the second transfer gate side than on the first transfer gate side, a distribution state is achieved with which the signal charges can be easily transferred from the charge holding region to the floating diffusion region by the second transfer gate. Therefore, when signal charges that have been transferred to the charge holding region from the light receiving element are transferred to the floating diffusion region, the amount of signal charges that are not transferred to the floating diffusion region can be reduced.

Here, the charge holding region may have a first width along an end portion of the first transfer gate and a second width, which is larger than the first width, along an end portion of the second transfer gate. Accordingly, the potential in the charge holding region is higher on the second transfer gate side, which has a larger width, than on the first transfer gate side, and as a result, signal charges (negative charges) that have been transferred from the light receiving element to the charge holding region by the first transfer gate tend to be distributed more on the second transfer gate side than on the first transfer gate side.

Also, the charge holding region may have a width that monotonously increases from the first width toward the second width. In that case, because the potential gradually changes in the charge holding region and a potential well is unlikely to be generated, the amount of charges that are not transferred due to the charges remaining in the potential well can be reduced.

Furthermore, the floating diffusion region has a first width along an end portion of the second transfer gate and a second width, which is smaller than the first width, on a side opposite to the second transfer gate. Accordingly, because the potential in the floating diffusion region is higher on the second transfer gate side, which has a larger width, than on the opposite side, the potential distribution is achieved with which signal charges can be easily transferred from the charge holding region to the floating diffusion region by the second transfer gate. Therefore, when the signal charges that have been transferred to the charge holding region from the light receiving element are transferred to the floating diffusion region, the amount of signal charges that are not transferred to the floating diffusion region can be reduced.

In that described above, the solid-state image capturing device may further include a pinning layer that is arranged in a portion of a principal surface of the charge holding region. The pinning layer may be arranged in a region whose distance from an end portion of the first transfer gate is less than or equal to a predetermined value. Accordingly, the potential in the charge holding region is higher on the second transfer gate side than on the first transfer gate side, and therefore the signal charges that have been transferred from the light receiving element to the charge holding region by the first transfer gate tend to be distributed more on the second transfer gate side than on the first transfer gate side.

In that case, the pinning layer has a shape that protrudes toward the second transfer gate more at both end portions than at a center in a width direction of the charge holding region. Accordingly, because the potential increases toward the center in the width direction of the charge holding region, signal charges tend to be distributed more in the vicinity of the center in the width direction of the charge holding region. Therefore, when the signal charges that have been transferred to the charge holding region from the light receiving element are transferred to the floating diffusion region, the amount of signal charges that are not transferred to the floating diffusion region can be reduced.

Also, the solid-state image capturing device may further include a metal film that is arranged on the semiconductor substrate via an interlayer insulating film, and is electrically connected to the gate electrode of the first transfer gate. The metal film may protrude, in plan view, from an end portion of the first transfer gate toward the second transfer gate over a predetermined distance. Accordingly, the potential in the charge holding region is lower on the first transfer gate side than on the second transfer gate side, and therefore the signal charges that have been transferred from the light receiving element to the charge holding region by the first transfer gate tend to be distributed more on the second transfer gate side than on the first transfer gate side.

In that case, the metal film may have a shape that protrudes toward the second transfer gate more at both end portions than at a center in a width direction of the charge holding region, in plan view. Accordingly, because the potential increases toward the center of the charge holding region in the width direction, signal charges tend to be distributed more in the vicinity of the center of the charge holding region in the width direction. Therefore, when the signal charges that have been transferred to the charge holding region from the light receiving element are transferred to the floating diffusion region, the amount of signal charges that are not transferred to the floating diffusion region can be reduced.

An electronic apparatus according to a second aspect of the invention includes any of the solid-state image capturing devices described above. According to the second aspect of the invention, as a result of using the solid-state image capturing device in which, when the signal charges that have been transferred to the charge holding region from the light receiving element are transferred to the floating diffusion region, the amount of signal charges that are not transferred to the floating diffusion region can be reduced, an electronic apparatus in which image quality of image data obtained by capturing a subject is improved can be provided.

According to another aspect of the invention, a solid-state image capturing device may include: a light receiving element arranged in a semiconductor substrate; a first transistor configured to receive signal charges from the light receiving element; a second transistor; a charge holding region; and a floating diffusion region arranged in a semiconductor substrate so as to be disposed between the charge holding region and the second transistor. The charging holding region is: (1) arranged in the semiconductor substrate so as to be in between the first transistor and the second transistor, and (2) is configured to have a potential gradient such that signal charges that are received from the light receiving element to the charge holding region by a first transfer gate of the first transistor are distributed more on a second transfer gate of the second transistor than on the first transfer gate.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
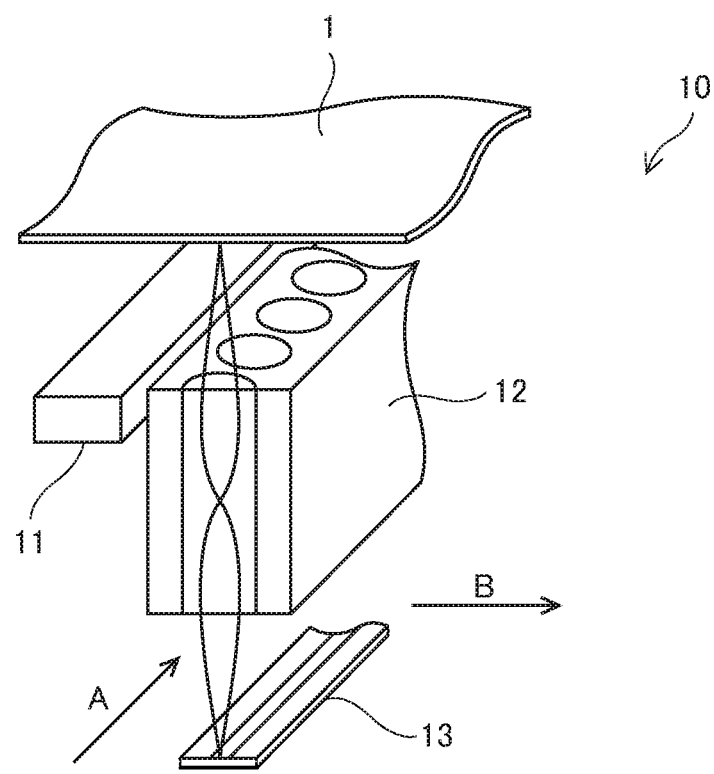
FIG. 1 is a perspective view illustrating an exemplary configuration of a CIS module.

Hereinafter, embodiments of the invention will be described in detail with reference to the drawings. The same constituent elements are given the same reference numerals, and a redundant description is omitted.

Electronic Apparatus

Hereinafter, a CIS type scanner device using a contact image sensor (CIS) module including a solid-state image capturing device (image sensor chip) according to any of the embodiments of the invention will be described as an electronic apparatus according to one embodiment of the invention.

Figure 2:
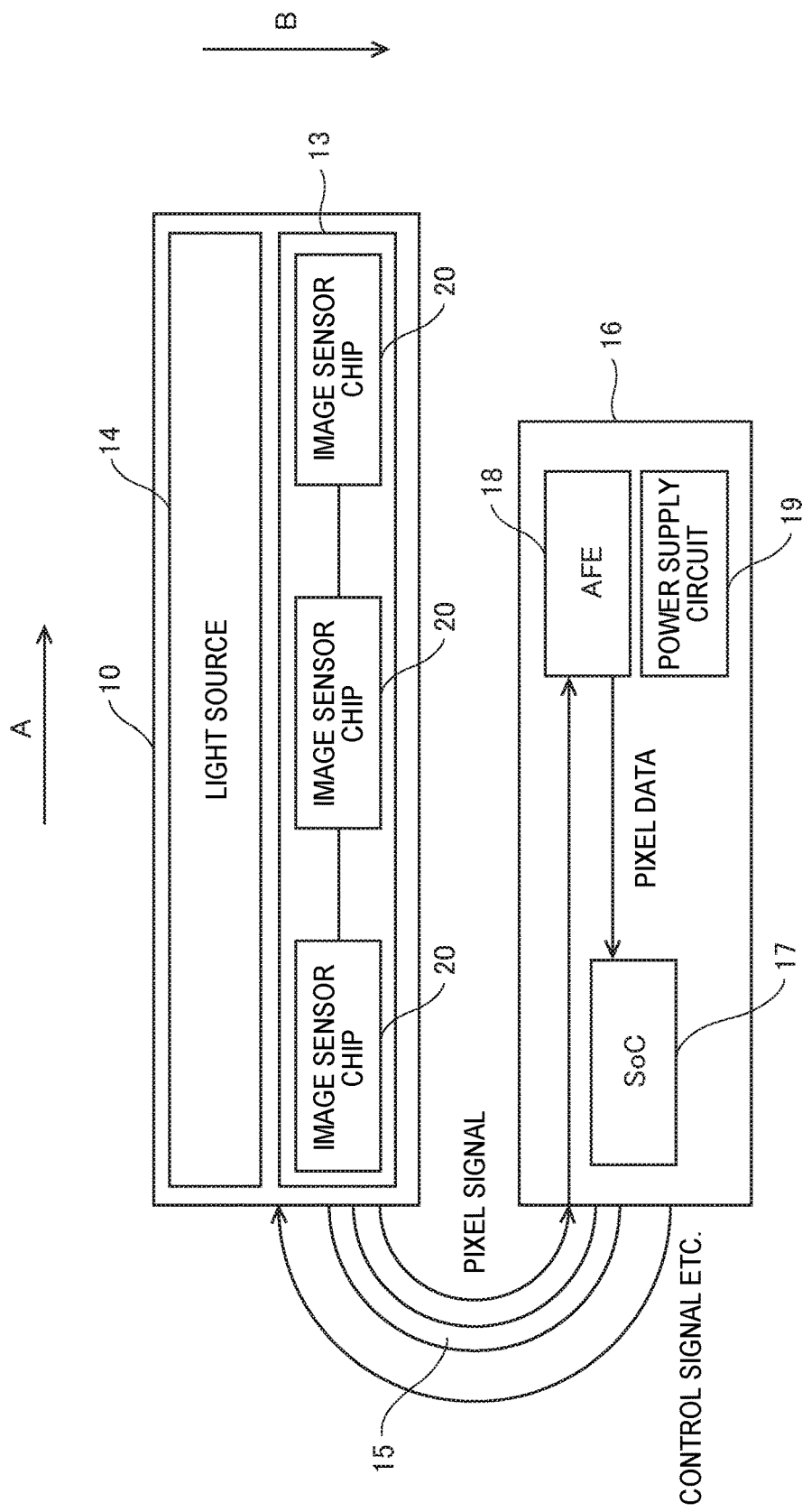
FIG. 2 is a block diagram illustrating an exemplary configuration of a scanner device using the CIS module.

FIG. 1 is a perspective view illustrating an exemplary configuration of a CIS module, and FIG. 2 is a block diagram illustrating an exemplary configuration of a scanner device using the CIS module shown in FIG. 1. As shown in FIG. 1, a CIS module 10 includes a light guide 11 that irradiates a document 1 with light, a lens array 12 that forms an image using light reflected from the document 1, and an image sensor 13 that includes light receiving elements such as photodiodes arranged at a position where the image is formed.

With reference to FIGS. 1 and 2, the CIS module 10 includes a light source 14 that generates light that is to be incident on an end portion of the light guide 11. In the case of a color scanner, the light source 14 includes red (R), green (G), and blue (B) LEDs. The LEDs of three colors are pulse-lighted in a time division manner. The light guide 11 guides light such that a region of the document 1 along the main scanning direction A is irradiated with light generated by the light source 14.

The lens array 12 is constituted by a rod lens array or the like, for example. The image sensor 13 includes a plurality of pixels along the main scanning direction A, and moves in the sub scanning direction B along with the light guide 11 and the lens array 12.

As shown in FIG. 2, the image sensor 13 may be constituted by a plurality of image sensor chips 20 connected in series. The CIS module 10 that can move in the sub scanning direction B is connected to a main board 16 that is fixed to the scanner device via a flexible wiring 15. A system on chip (SoC) 17, an analog front end (AFE) 18, and a power supply circuit 19 are mounted on the main board 16.

The system on chip 17 supplies a control signal, a clock signal, and the like to the CIS module 10. A pixel signal generated by the CIS module 10 is supplied to the analog front end 18. The analog front end 18 performs analog/digital conversion on an analog pixel signal, and outputs digital pixel data to the system on chip 17.

The power supply circuit 19 supplies a power supply voltage to the system on chip 17 and the analog front end 18, and supplies a power supply voltage, a reference voltage, and the like to the CIS module 10. Note that portions of the analog front end 18 and the power supply circuit 19, or a light source driver and the like may be mounted on the CIS module 10.

Solid-State Image Capturing Device

Figure 3:
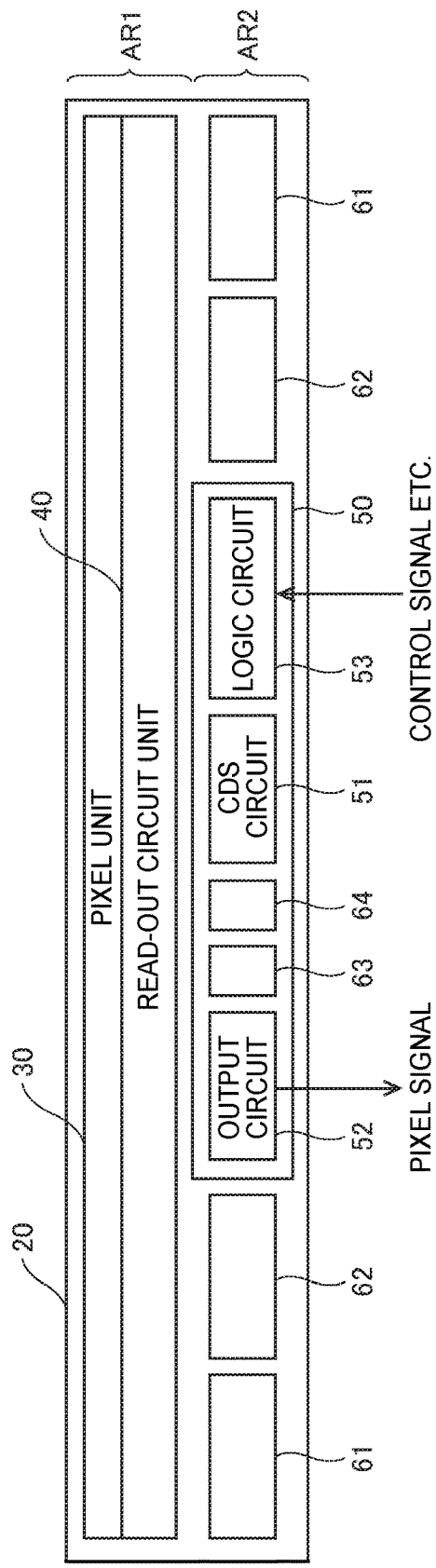
FIG. 3 is a block diagram illustrating an exemplary configuration of an image sensor chip.

FIG. 3 is a block diagram illustrating an exemplary configuration of an image sensor chip that is a solid-state image capturing device according to any of the embodiments of the invention. As shown in FIG. 3, the image sensor chip 20 includes a pixel unit 30, a read-out circuit unit 40, and a control circuit unit 50, and may further include capacitors 61 to 64.

In the pixel unit 30, a light receiving element (photodiode, for example) is arranged in each of a plurality of pixels. The read-out circuit unit 40 reads out pixel information by converting a signal charge that is output from the pixel unit 30 to a signal voltage. The control circuit unit 50 performs control so as to generate a pixel signal based on an output voltage of the read-out circuit unit 40. For example, the control circuit unit 50 includes a correlated double sampling (CDS: correlated double sampling) circuit 51, an output circuit 52, and a logic circuit 53.

The correlated double sampling circuit 51 performs correlated double sampling processing on the output voltage of the read-out circuit unit 40. That is, the correlated double sampling circuit 51 samples a voltage immediately after reset and a voltage after exposure, and cancels reset noise by performing processing for obtaining the difference between the sampled voltages, and generates an output voltage according to the intensity of light. The output circuit 52 generates a pixel signal based on the output voltage of the correlated double sampling circuit 51, and outputs the pixel signal. The logic circuit 53 is supplied with a control signal, a clock signal, and the like from the system on chip 17 shown in FIG. 2.

The capacitors 61 are connected between an interconnect of a high potential side power supply potential and an interconnect of a low potential side power supply potential that are arranged in a first region AR1 of the image sensor chip 20, and stabilizes a power supply voltage. Also, the capacitors 62 to 64 are connected between an interconnect of the high potential side power supply potential and an interconnect of the low potential side power supply potential that are arranged in a second region AR2 of the image sensor chip 20, and stabilize the power supply voltage.

Pixel Unit and Read-Out Circuit Unit

Figure 4:
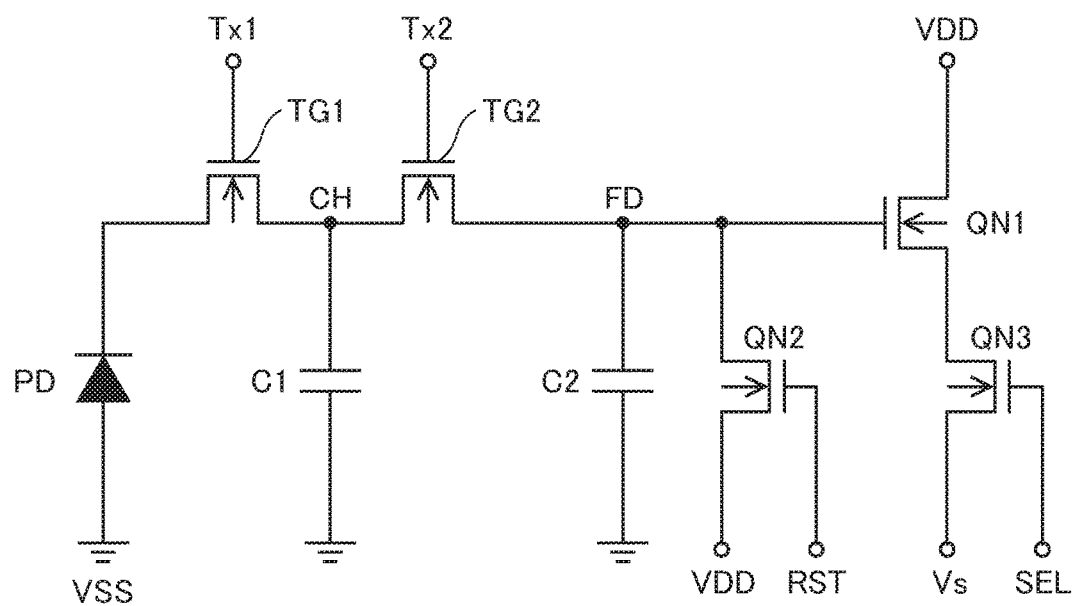
FIG. 4 is a circuit diagram illustrating an equivalent circuit of a pixel unit and a read-out circuit unit corresponding to one pixel.

FIG. 4 is a circuit diagram illustrating an equivalent circuit of a pixel unit and a read-out circuit unit corresponding to one pixel. A photodiode PD, for example, is arranged in one pixel of the pixel unit 30 shown in FIG. 3, as a light receiving element having a photoelectric conversion function. The photodiode PD generates signal charges according to the intensity of light that is incident thereon, and accumulates the signal charges.

In order to read out signal charges from the photodiode PD, the read-out circuit unit 40 shown in FIG. 3 includes a pre-stage transfer gate TG1, which is a first transfer gate, a charge holding capacitor C1, a post-stage transfer gate TG2, which is a second transfer gate, and a charge holding capacitor C2. Furthermore, the read-out circuit unit 40 includes a transistor (referred to also as buffer transistor, in the present application) QN1 that constitutes a read-out buffer amplifier, a reset transistor QN2, and a selection transistor QN3. Note that, in the case where an analog shift register is provided at the last stage of the read-out circuit unit 40 in a line sensor in which a plurality of pixels are arranged in a row, the selection transistor QN3 may be included in the analog shift register.

Here, the pre-stage transfer gate TG1 is constituted by an N-channel MOS transistor whose source and drain are a cathode of the photodiode PD and a cathode (charge holding region CH) of a storage diode. Also, the storage diode constitutes the charge holding capacitor C1.

Furthermore, the post-stage transfer gate TG2 is constituted by an N-channel MOS transistor whose source and drain are the charge holding region CH and an N-type floating diffusion region (floating diffusion) FD arranged in a P-type semiconductor layer. Also, the P-type semiconductor layer and the N-type floating diffusion region FD constitute the charge holding capacitor C2. Note that, in the present application, the semiconductor layer refers to a semiconductor substrate, a well formed in the semiconductor substrate, or an epitaxial layer formed on the semiconductor substrate.

The photodiode PD, the pre-stage transfer gate TG1, and the post-stage transfer gate TG2 are connected in series between an interconnect of a low potential side power supply potential VSS, and a gate electrode of the buffer transistor QN1. Also, a drain of the buffer transistor QN1 is connected to an interconnect of a high potential side power supply potential VDD. In the following, the power supply potential VSS is assumed to be ground potential 0V.

The reset transistor QN2 has a drain connected to the interconnect of the power supply potential VDD, a source connected to the gate electrode of the buffer transistor QN1, and a gate electrode to which a reset signal RST is supplied. Also, the selection transistor QN3 has a drain connected to a source of the buffer transistor QN1, a source connected to an output terminal of the read-out circuit unit 40, and a gate electrode to which a pixel selection signal SEL is supplied.

The pre-stage transfer gate TG1 transfers the signal charges accumulated in the photodiode PD to the charge holding capacitor C1 when a control signal Tx1 is activated to a high level. The charge holding capacitor C1 holds the signal charges transferred by the pre-stage transfer gate TG1. After the control signal Tx1 is inactivated to a low level, a control signal Tx2 is activated to a high level. The post-stage transfer gate TG2 transfers the signal charge held in the charge holding capacitor C1 to the charge holding capacitor C2 when a control signal Tx2 is activated to a high level. The charge holding capacitor C2 holds the signal charge transferred by the post-stage transfer gate TG2, and converts the signal charges into a signal voltage.

The reset transistor QN2 resets the gate potential of the buffer transistor QN1 to an initial state potential (power supply potential VDD, for example), when the reset signal RST is activated to a high level. When the reset is released, the buffer transistor QN1 outputs an output voltage according to the signal voltage across the charge holding capacitor C2 from the source.

The selection transistor QN3 selects the output voltage of the buffer transistor QN1 when the pixel selection signal SEL is activated to a high level. Accordingly, the output voltage of the buffer transistor QN1 is output to the output terminal of the read-out circuit unit 40 via the selection transistor QN3, and an output voltage Vs is thereby generated.

Unit Block of Pixel Unit and Read-Out Circuit Unit

Figure 5:
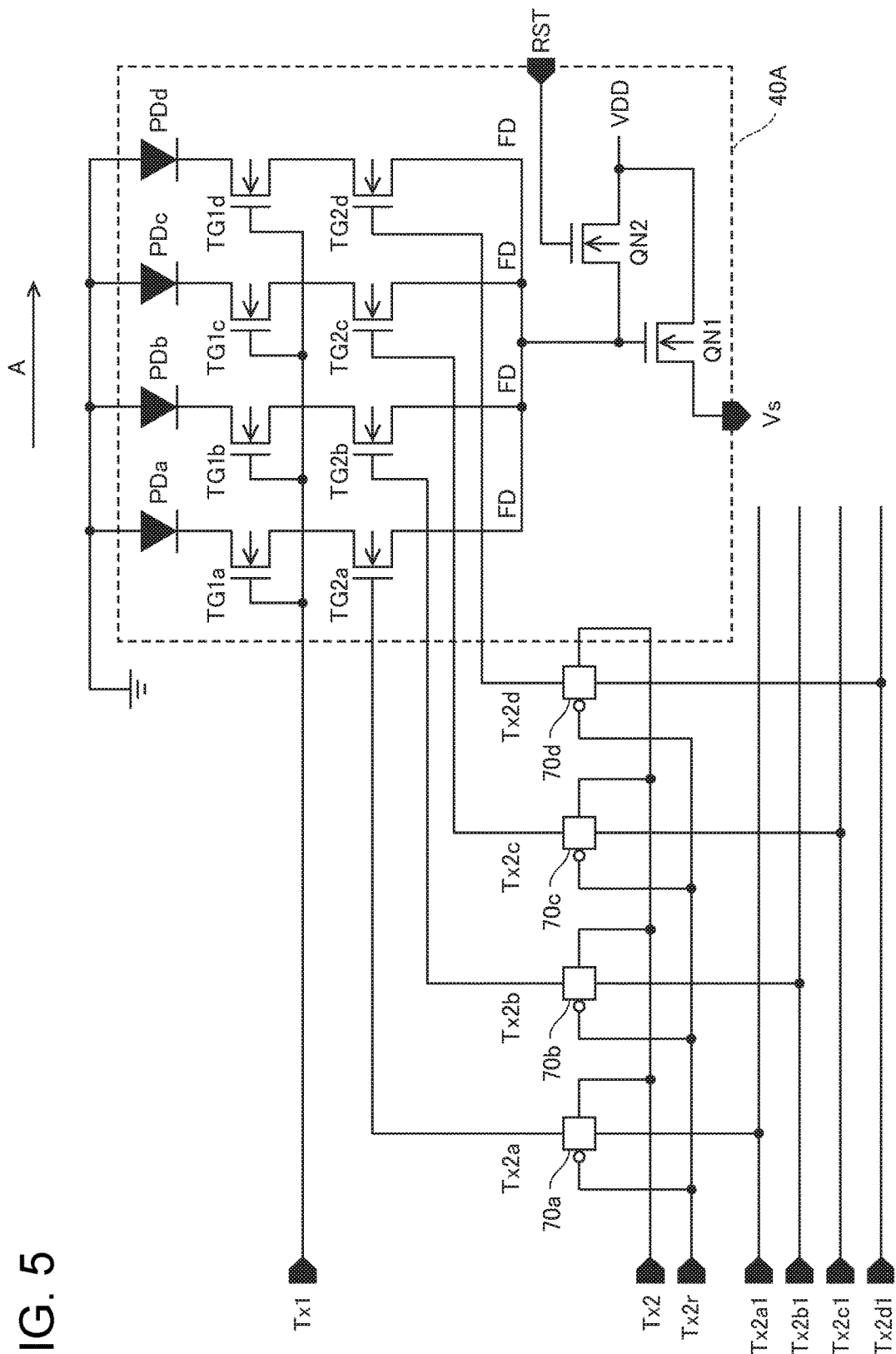
FIG. 5 is a circuit diagram illustrating an example of a unit block in a line sensor.

FIG. 5 is a circuit diagram illustrating an example of a unit block of the pixel unit and the read-out circuit unit in the line sensor. As shown in FIG. 5, four photodiodes PDa to PDd that are arranged successively in the main scanning direction A, and the read-out circuit unit for reading out pieces of pixel information by converting signal charges transferred from the photodiodes PDa to PDd to signal voltages constitute one unit block 40A. The number of unit blocks 40A provided in one line sensor is 216, for example.

The read-out circuit unit in the unit block 40A includes four pre-stage transfer gates TG1a to TG1d, four post-stage transfer gates TG2a to TG2d, one buffer transistor QN1, and one reset transistor QN2. That is, one buffer transistor QN1 and one reset transistor QN2 are shared between the four photodiodes PDa to PDd.

Here, the four pre-stage transfer gates TG1a to TG1d are controlled to be turned on at the same time irrespective of resolution modes. On the other hand, because the four photodiodes PDa to PDd each constitute one pixel, the four post-stage transfer gates TG2a to TG2d are controlled to be turned on at different timings. Accordingly, four output voltages respectively corresponding to the signal charges of the four photodiodes PDa to PDd are output from the unit block 40A in a time division manner.

A control signal Tx1 that is supplied to the four pre-stage transfer gates TG1a to TG1d in common, and four control signals Tx2a to Tx2d that are respectively supplied to the four post-stage transfer gates TG2a to TG2d are shown in FIG. 5. The common control signal Tx1 is supplied in order to turn on the four pre-stage transfer gates TG1a to TG1d at the same time, as described above.

Here, the control signal Tx1 supplied to the pre-stage transfer gates TG1a to TG1d and the control signals Tx2a to Tx2d respectively supplied to the post-stage transfer gates TG2a to TG2d may have different levels of high level potential. For example, the high level of the control signal Tx1 that is supplied to the pre-stage transfer gates TG1a to TG1d is higher than the power supply potential VDD.

That is, as a result of supplying the control signal Tx1 having higher potential than the power supply potential VDD to the pre-stage transfer gates TG1a to TG1d, the charge transfer capability of the pre-stage transfer gates TG1a to TG1d when turned on is not saturated at an exposure intensity that is less than or equal to a prescribed value, or the saturation level can be improved. Accordingly, the signal charges accumulated in the photodiodes PDa to PDd can be transferred with high transfer capability, and an image having a high contrast can be formed.

On the other hand, the control signals Tx2a to Tx2d are respectively supplied to the post-stage transfer gates TG2a to TG2d from CMOS logic circuits 70a to 70d, as shown in FIG. 5. The CMOS logic circuits 70a to 70d are turned on based on block selection signals Tx2 and Tx2r for selecting the unit block 40A, and supply timing signals Tx2a1 to Tx2d1 to the unit block 40A as control signals Tx2a to Tx2d. At this time, the control signals Tx2a to Tx2d are generated without causing a voltage drop, and therefore the transfer capability of the post-stage transfer gates TG2a to TG2d can be improved.

Although an analog switch (transmission gate) constituted by a P-channel MOS transistor and an N-channel MOS transistor is used as each of the CMOS logic circuits 70a to 70d in FIG. 5, the configuration of the CMOS logic circuits 70a to 70d is not limited thereto. For example, a circuit that does not cause a voltage drop such as a clocked CMOS logic circuit or an AND gate circuit can be used as each of the CMOS logic circuits 70a to 70d.

On the other hand, an area sensor in which a plurality of pixels are arranged in a two-dimensional matrix includes pixel units and read-out circuit units that are arranged in a plurality of lines, and an equivalent circuit of the pixel unit and the read-out circuit unit corresponding to one pixel is similar to the equivalent circuit shown in FIG. 4. Signal charges are transferred from the light receiving elements in the plurality of lines to the respective charge holding regions CH (hereinafter, refer to FIG. 4) at the same time. This function is referred to as global shutter (electronic shutter).

Thereafter, signal charges held in the charge holding regions CH in the line that is sequentially selected are transferred to the respective floating diffusion regions FD, the selection transistors QN3 are turned on, and output voltages of the buffer transistors QN1 are output to output terminals of the respective read-out circuit units via the selection transistors QN3. The solid-state image capturing device described below may be a line sensor or an area sensor.

First Embodiment

Figure 6:
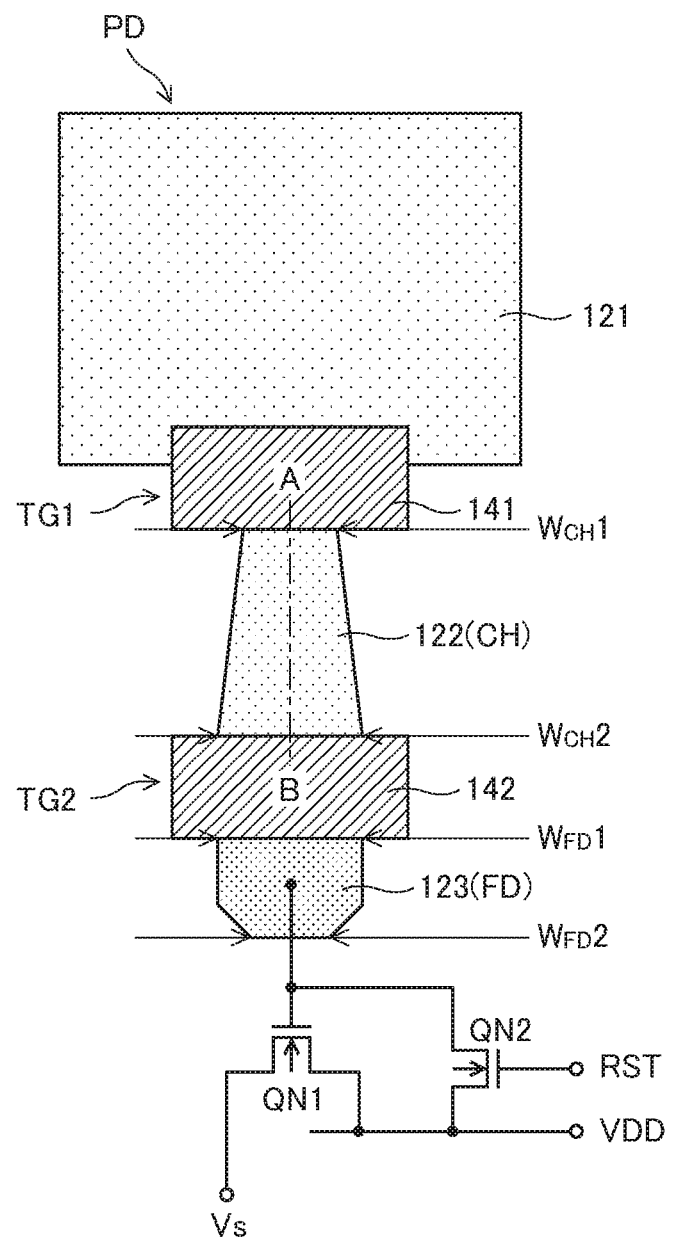
FIG. 6 is a plan view of a portion of a solid-state image capturing device according to a first embodiment of the invention.
Figure 7:
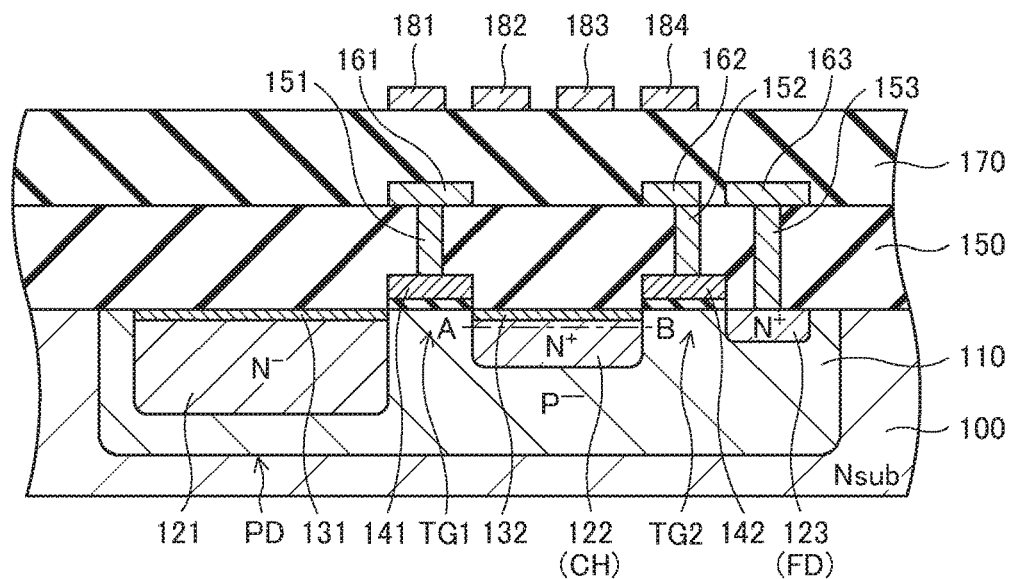
FIG. 7 is a cross-sectional view taken along an extension line of line A-B in FIG. 6.

FIG. 6 is a plan view of a portion of a solid-state image capturing device according to a first embodiment of the invention, and FIG. 7 is a cross-sectional view taken along an extension line of line A-B in FIG. 6. As shown in FIGS. 6 and 7, the solid-state image capturing device includes an N-type semiconductor substrate (Nsub) 100, a P-well (P$^{--}$) 110 formed in the semiconductor substrate 100, and an N-type impurity region (N$^{-}$) 121, a charge holding region (CH) 122, and a floating diffusion region (FD) 123 that are formed in the P-well 110. The charge holding region 122 and the floating diffusion region 123 are N-type impurity regions (N$^{+}$) with high concentrations.

A silicon (Si) substrate including N-type impurities such as phosphorus (P) or arsenic (As) is used as the semiconductor substrate 100, for example. Also, the P-well 110 is formed by implanting P-type impurity ions such as boron (B) into the semiconductor substrate 100 and thermally diffusing the impurities by performing heat treatment, for example.

The photodiode PD has an anode constituted by the P-well 110 and a cathode constituted by the N-type impurity region 121. As shown in FIG. 7, P-type impurity regions (pinning layer) 131 and 132 having high concentration may be respectively arranged in an upper portion of the N-type impurity region 121 and the charge holding region 122. In the case of providing a pinning layer, a dark current generated in the N-type impurity region 121 or the charge holding region 122 can be reduced.

In this way, the solid-state image capturing device includes the light receiving element (photodiode PD), the charge holding region 122, and the floating diffusion region 123 that are arranged in the semiconductor substrate 100. Also, the solid-state image capturing device includes the pre-stage transfer gate TG1 having a gate electrode 141 that is arranged on a region between the light receiving element and the charge holding region 122 in the semiconductor substrate 100 via a gate insulating film, and the post-stage transfer gate TG2 having a gate electrode 142 that is arranged on a region between the charge holding region 122 and the floating diffusion region 123 in the semiconductor substrate 100 via a gate insulating film.

The gate electrodes 141 and 142 are made of polysilicon that has been doped with impurities so as to be conductive, or the like, for example. Also, the buffer transistor QN1 and the reset transistor QN2 are also shown in FIG. 6.

Furthermore, the solid-state image capturing device includes an interlayer insulating film 150 arranged on the semiconductor substrate 100, a first interconnect layer including interconnects 161 to 163 that is arranged on the interlayer insulating film 150, an interlayer insulating film 170 that is arranged on the interlayer insulating film 150 and the first interconnect layer, and a second interconnect layer including interconnects 181 to 184 that is arranged on the interlayer insulating film 170. Note that a light shielding film that shields the charge holding region 122 may be arranged on the interlayer insulating film 170, and the interconnects 181 to 184 may be arranged in another region, or in a third interconnect layer or the like.

The interlayer insulating films 150 and 170 are made of BPSG (Boron Phosphorus Silicon Glass), silicon oxide ($SiO_2$), or the like, for example. Contact plugs 151 to 153 including tungsten (W), aluminum (Al), copper (Cu), or the like are respectively arranged in contact holes formed in the interlayer insulating film 150. Also, the interconnects 161 to 163 and 181 to 184 include, for example, aluminum (Al), copper (Cu), or the like.

The interconnect 161 in the first interconnect layer is electrically connected to the gate electrode 141 of the pre-stage transfer gate TG1 via the contact plug 151. The interconnect 162 is electrically connected to the gate electrode 142 of the post-stage transfer gate TG2 via the contact plug 152. The interconnect 163 electrically connects the floating diffusion region 123 to the gate electrode of the buffer transistor QN1 (FIG. 6) via the contact plug 153.

In the first embodiment, as shown in FIG. 6, the charge holding region 122 has a first width $W_{CH}1$ along an end portion of the pre-stage transfer gate TG1 and a second width $W_{CH}2$, which is larger than the first width $W_{CH}1$, along an end portion of the post-stage transfer gate TG2. The ratio of first width $W_{CH}1$ and the second width $W_{CH}2$ is set to a ratio between 3:4 and 3:5, for example. The width of the charge holding region 122 may change continuously as shown in FIG. 6, or change stepwise.

Figure 8:
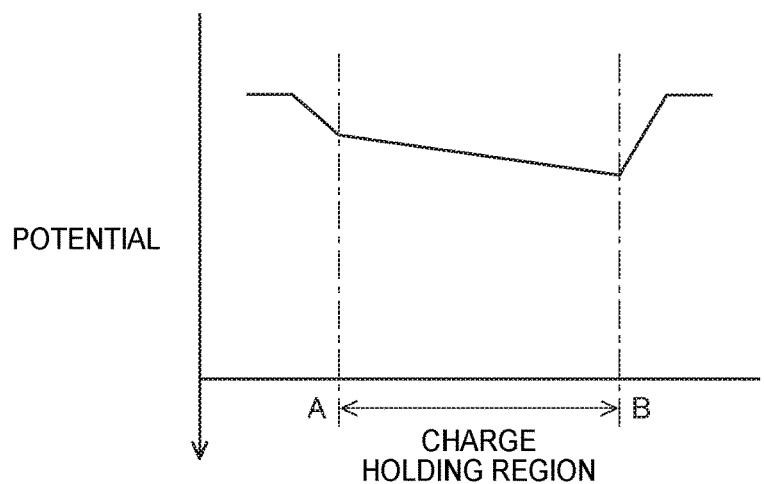
FIG. 8 is a diagram illustrating potential distribution along line A-B shown in FIGS. 6 and 7.

FIG. 8 is a diagram illustrating potential distribution along line A-B shown in FIGS. 6 and 7. Because the signal charges that are accumulated in the cathode of the photodiode PD are negative charges (electrons), the arrow indicating the increasing direction of the potential is directed downward in FIG. 8 and the like.

As shown in FIG. 8, with the plane shape of the charge holding region 122 shown in FIG. 6, the potential in the charge holding region 122 is higher on the post-stage transfer gate TG2 side (side B), which has a larger width than the pre-stage transfer gate TG1 side (side A), and therefore the signal charges that have been transferred from the light receiving element to the charge holding region 122 by the pre-stage transfer gate TG1 tend to be distributed more on the post-stage transfer gate TG2 side than on the pre-stage transfer gate TG1 side.

Therefore, the distribution state is achieved with which signal charges can be easily transferred from the charge holding region 122 to the floating diffusion region 123 by the post-stage transfer gate TG2, and when the signal charges that have been transferred to the charge holding region 122 from the light receiving element are transferred to the floating diffusion region 123, the amount of signal charges that are not transferred to the floating diffusion region 123 can be reduced.

As shown in FIG. 6, the charge holding region 122 may have a width that monotonously increases from the first width $W_{CH}1$ to the second width $W_{CH}2$. In that case, because the potential gradually changes in the charge holding region 122 and a potential well is unlikely to be generated, the amount of charges that are not transferred due to the charges remaining in the potential well can be reduced.

Also, as shown in FIG. 6, the floating diffusion region 123 may have a first width $W_{FD}1$ along the end portion of the post-stage transfer gate TG2, and have a second width $W_{FD}2$, which is smaller than the first width $W_{FD}1$, on the side opposite to the post-stage transfer gate TG2. The width of the floating diffusion region 123 may change continuously or may change stepwise.

Accordingly, because the potential in the floating diffusion region 123 is higher on the post-stage transfer gate TG2 side, which has a larger width, than on the opposite side, a potential distribution is achieved with which signal charges can be easily transferred from the charge holding region 122 to the floating diffusion region 123 by the post-stage transfer gate TG2. Therefore, when the signal charges that have been transferred to the charge holding region 122 from the light receiving element are transferred to the floating diffusion region 123, the amount of signal charges that are not transferred to the floating diffusion region 123 can be reduced.

Second Embodiment

Figure 9:
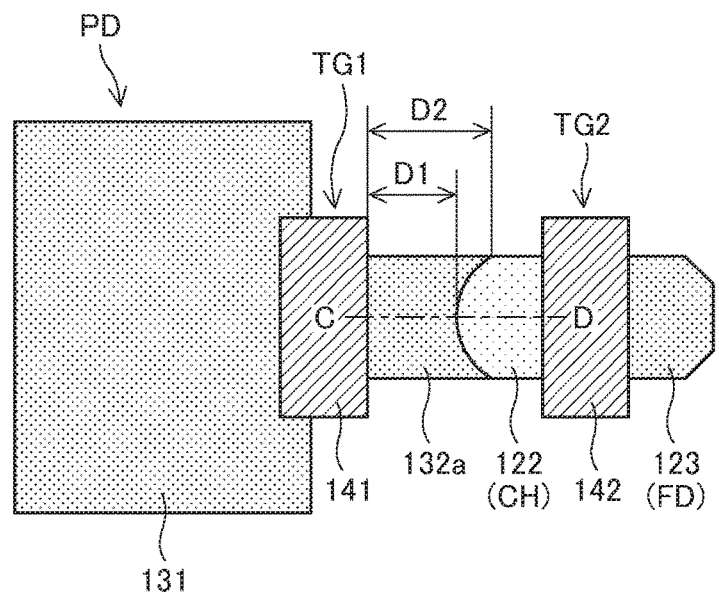
FIG. 9 is a plan view of a portion of a solid-state image capturing device according to a second embodiment of the invention.
Figure 10:
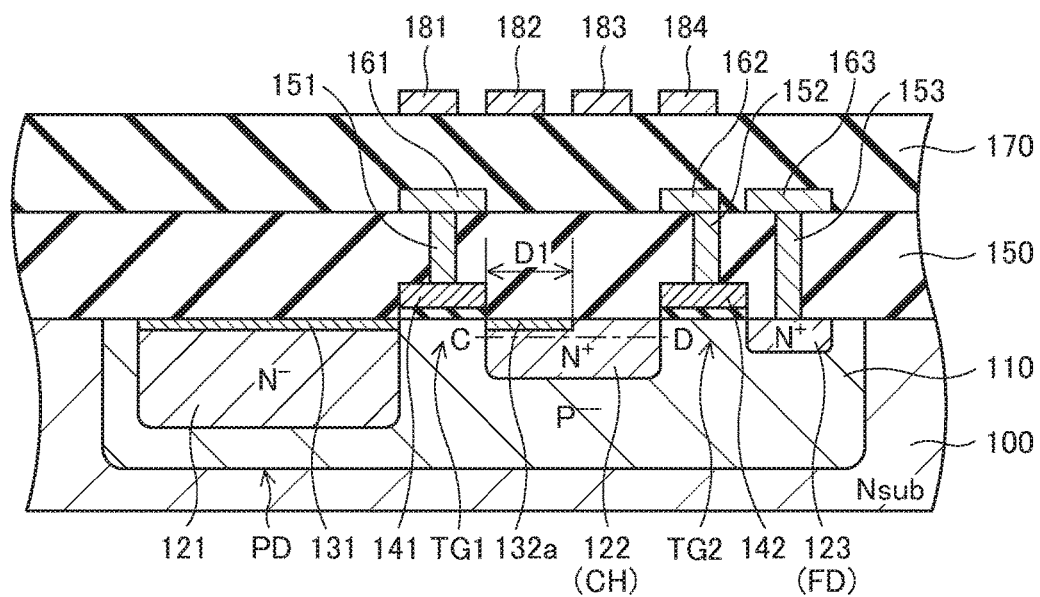
FIG. 10 is a cross-sectional view taken along an extension line of line C-D in FIG. 9.

FIG. 9 is a plan view of a portion of a solid-state image capturing device according to a second embodiment of the invention, and FIG. 10 is a cross-sectional view taken along an extension line of line C-D in FIG. 9. The solid-state image capturing device according to the second embodiment includes a pinning layer 132a that is arranged in a portion of a principal surface (upper surface in the diagram) of the charge holding region 122. In other respects, the second embodiment may be configured similarly to the first embodiment.

The pinning layer 132a is arranged in a region whose distance from the end portion of the pre-stage transfer gate TG1 is less than or equal to a predetermined value. Here, the predetermined value is smaller than the distance between the pre-stage transfer gate TG1 and the post-stage transfer gate TG2, and is desirably greater than or equal to half the distance between the pre-stage transfer gate TG1 and the post-stage transfer gate TG2.

Figure 11:
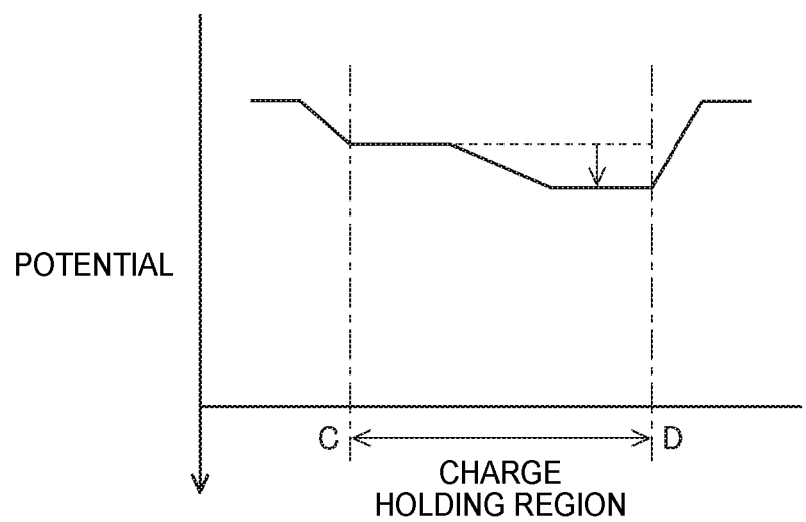
FIG. 11 is a diagram illustrating potential distribution along line C-D shown in FIGS. 9 and 10.

FIG. 11 is a diagram illustrating a potential distribution along line C-D shown in FIGS. 9 and 10. In FIG. 11, the broken line shows potential distribution in the case where a pinning layer is arranged on the entire principal surface of the charge holding region 122, and the solid line shows potential distribution in the case where the pinning layer 132a is arranged in a portion of the principal surface of the charge holding region 122.

The pinning layer 132a is supplied with the power supply potential VSS, and has the role of decreasing the potential. Accordingly, as shown in FIG. 11, the potential under the region where the pinning layer 132a is not arranged is higher than that under the region where the pinning layer 132a is arranged. That is, the potential in the charge holding region 122 is higher on the post-stage transfer gate TG2 side (side D) than on the pre-stage transfer gate TG1 side (side C), and therefore the signal charges that have been transferred from the light receiving element to the charge holding region 122 by the pre-stage transfer gate TG1 tend to be distributed more on the post-stage transfer gate TG2 side than on the pre-stage transfer gate TG1 side.

Therefore, the distribution state is achieved with which signal charges can be easily transferred from the charge holding region 122 to the floating diffusion region 123 by the post-stage transfer gate TG2, and when the signal charges that have been transferred to the charge holding region 122 from the light receiving element are transferred to the floating diffusion region 123, the amount of signal charges that are not transferred to the floating diffusion region 123 can be reduced.

As shown in FIG. 9, the pinning layer 132a may have a shape that protrudes toward the post-stage transfer gate TG2 more at both end portions than at the center in the width direction of the charge holding region 122. Accordingly, because the potential increases toward the center in the width direction of the charge holding region 122, signal charges tend to be distributed more in the vicinity of the center in the width direction of the charge holding region 122. Therefore, when the signal charges that have been transferred to the charge holding region 122 from the light receiving element are transferred to the floating diffusion region 123, the amount of signal charges that are not transferred to the floating diffusion region 123 can be reduced.

In FIG. 9, distances D1 and D2 from a right end of the pre-stage transfer gate TG1 to a right end of the pinning layer 132a are shown. Here, the distance D1 on the central axis of the charge holding region 122 is desirably greater than or equal to half the distance between the pre-stage transfer gate TG1 and the post-stage transfer gate TG2. Also, the distance D2 at the both end portions of the charge holding region 122 is desirably larger than the distance D1 on the central axis of the charge holding region 122 and smaller than the distance between the pre-stage transfer gate TG1 and the post-stage transfer gate TG2.

Third Embodiment

Figure 12:
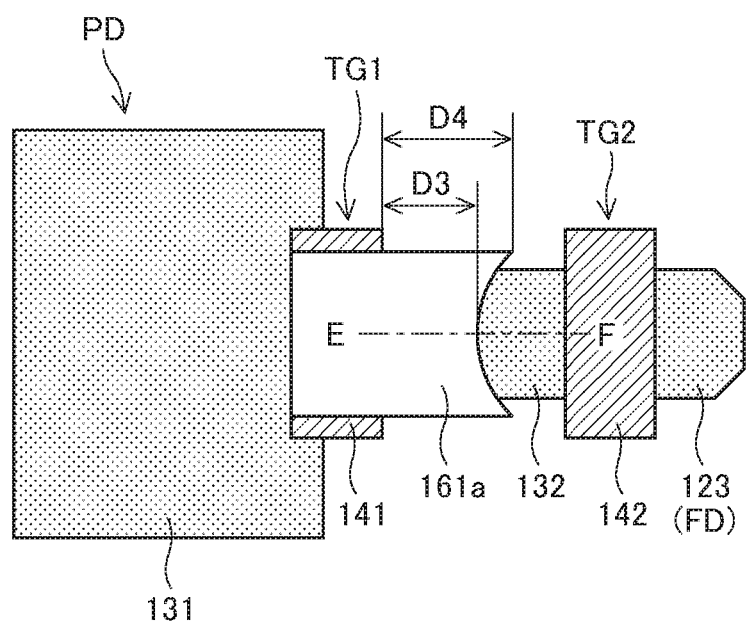
FIG. 12 is a plan view of a portion of a solid-state image capturing device according to a third embodiment of the invention.
Figure 13:
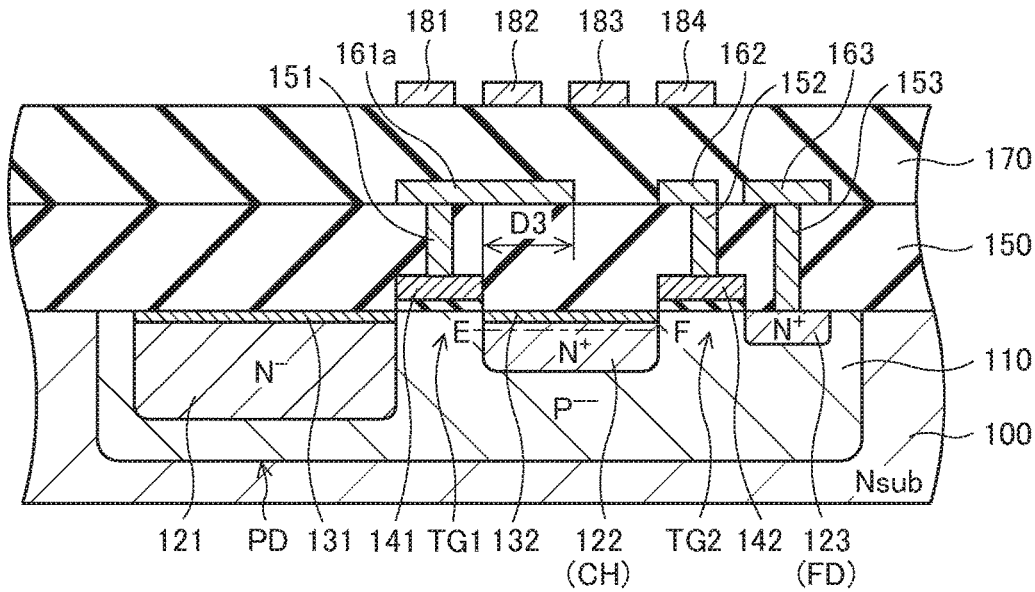
FIG. 13 is a cross-sectional view taken along an extension line of line E-F in FIG. 12.

FIG. 12 is a plan view of a portion of a solid-state image capturing device according to a third embodiment of the invention, and FIG. 13 is a cross-sectional view taken along an extension line of line E-F in FIG. 12. The solid-state image capturing device according to the third embodiment further includes a metal film 161a that is arranged on the semiconductor substrate 100 via the interlayer insulating film 150, and is electrically connected to the gate electrode 141 of the pre-stage transfer gate TG1. In other respects, the third embodiment may be configured similarly to the first or second embodiment.

The metal film 161a protrudes, in plan view, from the end portion of the pre-stage transfer gate TG1 toward the post-stage transfer gate TG2 over a predetermined distance. Here, the predetermined distance is desirably larger than zero and smaller than the distance between the pre-stage transfer gate TG1 and the post-stage transfer gate TG2. Note that, in the present application, "in plan view" refers to viewing portions in a direction vertical to the principal surface (upper surface in the diagram) of the semiconductor substrate 100 in a see-through manner.

The metal film 161a includes aluminum (Al), copper (Cu), or the like, similarly to the interconnect 162 and the like. In a period during which the pre-stage transfer gate TG1 and the post-stage transfer gate TG2 are in an off state, a control signal at a low level (power supply potential VSS) is supplied to the metal film 161a and the interconnect 162.

Figure 14:
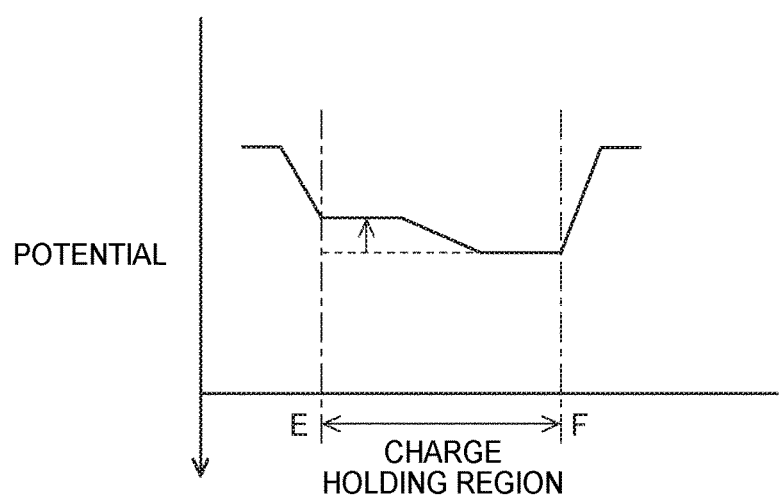
FIG. 14 is a diagram illustrating potential distribution along line E-F shown in FIGS. 12 and 13.

FIG. 14 is a diagram illustrating potential distribution along line E-F shown in FIGS. 12 and 13. In FIG. 14, the broken line shows potential distribution in the case where the metal film 161a is not arranged, and the solid line shows potential distribution in the case where the metal film 161a is arranged.

As shown in FIG. 14, the potential under the region where the metal film 161a is arranged is lower than that under the region where the metal film 161a is not arranged, due to the influence of an electric field formed by the metal film 161a. That is, the potential in the charge holding region 122 is lower on the pre-stage transfer gate TG1 side (side E) than on the post-stage transfer gate TG2 side (side F), and therefore the signal charges that have been transferred from the light receiving element to the charge holding region 122 by the pre-stage transfer gate TG1 tend to be distributed more on the post-stage transfer gate TG2 side than on the pre-stage transfer gate TG1 side.

Therefore, the distribution state of signal charges is achieved with which signal charges can be easily transferred from the charge holding region 122 to the floating diffusion region 123 by the post-stage transfer gate TG2, and when the signal charges that have been transferred to the charge holding region 122 from the light receiving element are transferred to the floating diffusion region 123, the amount of signal charges that are not transferred to the floating diffusion region 123 can be reduced. On the other hand, the interconnect 162 does not protrude, in plan view, from the end portion of the post-stage transfer gate TG2 toward the pre-stage transfer gate TG1 in order to not decrease the potential in the charge holding region 122 on the post-stage transfer gate TG2 side (side F).

As shown in FIG. 12, the metal film 161a may have a shape that protrudes toward the post-stage transfer gate TG2 more at the both end portions than at the center in the width direction of the charge holding region 122, in plan view. Accordingly, because the potential increases toward the center of the charge holding region 122 in the width direction, signal charges tend to be distributed more in the vicinity of the center of the charge holding region 122 in the width direction. Therefore, when the signal charges that have been transferred to the charge holding region 122 from the light receiving element are transferred to the floating diffusion region 123, the amount of signal charges that are not transferred to the floating diffusion region 123 can be reduced.

In FIG. 12, distances D3 and D4 from the right end of the pre-stage transfer gate TG1 to the right end of the metal film 161a are shown. Here, the distance D3 on the central axis of the metal film 161a is desirably larger than zero and less than or equal to half the distance between the pre-stage transfer gate TG1 and the post-stage transfer gate TG2. Also, the distance D4 at the both end portions of the metal film 161a is desirably larger than the distance D3 on the central axis of the metal film 161a and smaller than the distance between the pre-stage transfer gate TG1 and the post-stage transfer gate TG2.

As described above, the solid-state image capturing devices according to the first to third embodiments are configured to have a potential gradient in the charge holding region 122 such that signal charges that have been transferred from the light receiving element to the charge holding region 122 by the pre-stage transfer gate TG1 are distributed more on the post-stage transfer gate TG2 side than on the pre-stage transfer gate TG1 side. Note that two or more of the first to third embodiments may be combined for implementation.

According to the first to third embodiments, signal charges that have been transferred from the light receiving element to the charge holding region 122 by the pre-stage transfer gate TG1 are distributed more on the post-stage transfer gate TG2 side than on the pre-stage transfer gate TG1 side, and as a result, a distribution state of signal charges is achieved with which the signal charges can be easily transferred from the charge holding region 122 to the floating diffusion region 123 by the post-stage transfer gate TG2. Therefore, when the signal charges that have been transferred to the charge holding region 122 from the light receiving element are transferred to the floating diffusion region 123, the amount of signal charges that are not transferred to the floating diffusion region 123 can be reduced.

In this way, as a result of using a solid-state image capturing device in which, when the signal charges that have been transferred to the charge holding region 122 from the light receiving element are transferred to the floating diffusion region 123, the amount of signal charges that are not transferred to the floating diffusion region 123 can be reduced, an electronic apparatus in which image quality of image data obtained by capturing a subject is improved can be provided.

Also, the solid-state image capturing devices according to the first to third embodiments can be applied, other than the scanner device, to electronic apparatuses that capture a subject and generate image data, such as a drive recorder, a digital movie camera, a digital still camera, a mobile terminal such as a mobile phone, a TV phone, a surveillance television monitor, a measurement apparatus, and a medical apparatus, for example.

In the embodiments described above, a case where the N-type impurity region and the like are formed in the P-type semiconductor layer was described, but the invention is not limited to the embodiments described above. For example, the invention can also be applied to a case where a P-type impurity region and the like are formed in an N-type semiconductor layer. In this way, many modifications can be made within the technical idea of the invention by a person having ordinary skill in the art.

What is claimed is:

1. A solid-state image capturing device comprising:
   a light receiving element that has at least one layer and is arranged in a semiconductor substrate;
   a charge holding region that is arranged in the semiconductor substrate;
   a floating diffusion region that is arranged in the semiconductor substrate;
   a first transfer gate including a gate electrode that is arranged on a region between the light receiving element and the charge holding region in the semiconductor substrate via a gate insulating film; and
   a second transfer gate including a gate electrode that is arranged on a region between the charge holding region and the floating diffusion region in the semiconductor substrate via a gate insulating film,
   wherein the solid-state image capturing device is configured to have a potential gradient in the charge holding region such that signal charges that have been transferred from the light receiving element to the charge holding region by the first transfer gate are distributed more on the second transfer gate than on the first transfer gate.

2. The solid-state image capturing device according to claim 1, wherein
   the charge holding region is an area of a cathode of a storage diode, and
   the first transfer gate is a gate of a field-effect transistor whose source and drain are a cathode of the light receiving element and the cathode of the storage diode, respectively.

3. The solid-state image capturing device according to claim 1, wherein
   the second transfer gate comprises a gate of a field-effect transistor whose source and drain are the charge holding region and the floating diffusion region, respectively.

4. The solid-state image capturing device according to claim 3, wherein
   the floating diffusion region is a cathode of a charge holding capacitor.

5. The solid-state image capturing device according to claim 1, wherein
   the first transfer gate is a gate of a field-effect transistor; and
   the light receiving element comprises a photodiode.

6. An electronic apparatus comprising the solid-state image capturing device according to claim 1.

7. A solid-state image capturing device comprising:
   a light receiving element that has at least one layer and is arranged in a semiconductor substrate;
   a charge holding region that is arranged in the semiconductor substrate;
   a floating diffusion region that is arranged in the semiconductor substrate;
   a first transfer gate including a gate electrode that is arranged on a region between the light receiving element and the charge holding region in the semiconductor substrate via a gate insulating film; and
   a second transfer gate including a gate electrode that is arranged on a region between the charge holding region and the floating diffusion region in the semiconductor substrate via a gate insulating film,
   wherein the charge holding region has differing widths including (1) a first width defined along an end of the first transfer gate and (2) a second width, which is greater than the first width, defined along an end of the second transfer gate.

8. The solid-state image capturing device according to claim 7, wherein the charge holding region has a width that steadily and continuously increases from the first width toward the second width.

9. The solid-state image capturing device according to claim 7, wherein
the charge holding region is a cathode of a storage diode, and
the first transfer gate is a gate of a field-effect transistor whose source and drain are a cathode of the light receiving element and the cathode of the storage diode, respectively.

10. The solid-state image capturing device according to claim 7, wherein
the second transfer gate comprises a gate of a field-effect transistor whose source and drain are the charge holding region and the floating diffusion region, respectively.

11. The solid-state image capturing device according to claim 10, wherein
the floating diffusion region is a cathode of a charge holding capacitor.

12. The solid-state image capturing device according to claim 7, wherein
the first transfer gate is a gate of a field-effect transistor; and
the light receiving element comprises a photodiode.

13. A solid-state image capturing device comprising:
a light receiving element that has at least one layer and is arranged in a semiconductor substrate;
a charge holding region that is arranged in the semiconductor substrate;
a floating diffusion region that is arranged in the semiconductor substrate;
a first transfer gate including a gate electrode that is arranged on a region between the light receiving element and the charge holding region in the semiconductor substrate via a gate insulating film; and
a second transfer gate including a gate electrode that is arranged on a region between the charge holding region and the floating diffusion region in the semiconductor substrate via a gate insulating film,
wherein the floating diffusion region has differing widths including (1) a first width defined along an end of the second transfer gate and (2) a second width, which is less than the first width, on a side opposite to the second transfer gate.

14. The solid-state image capturing device according to claim 13, further comprising:
a pinning layer that is arranged in a portion of a principal surface of the charge holding region,
wherein the pinning layer is arranged in a region whose distance from an end of the first transfer gate is less than or equal to a predetermined value.

15. The solid-state image capturing device according to claim 14, wherein
the pinning layer has a first end, second end, a center, and a width between the first end and second end, and
the pinning layer has a shape that protrudes toward the second transfer gate more at both the first and second ends than at the center in a width direction of the charge holding region.

16. The solid-state image capturing device according to claim 13, further comprising:
a metal film that is arranged on the semiconductor substrate via an interlayer insulating film, and is electrically connected to the gate electrode of the first transfer gate,
wherein the metal film protrudes, in plan view, from an end of the first transfer gate toward the second transfer gate over a predetermined distance.

17. The solid-state image capturing device according to claim 16, wherein
the metal film has a first end, second end, a center, and a width between the first end and second end, and
the metal film has a shape that protrudes toward the second transfer gate more at both the first end and second end than at the center in a width direction of the charge holding region, in plan view.

18. A solid-state image capturing device comprising:
a light receiving element arranged in a semiconductor substrate, the light receiving element comprising a cathode;
a first transistor configured to receive signal charges from the light receiving element;
a second transistor;
a charge holding region that is:
(1) arranged in the semiconductor substrate so as to be in between the first transistor and the second transistor, and
(2) is configured to have a potential gradient such that signal charges that are received from the light receiving element to the charge holding region by a first transfer gate of the first transistor are distributed more on a second transfer gate of the second transistor than on the first transfer gate; and
a floating diffusion region arranged in a semiconductor substrate so as to be disposed between the charge holding region and the second transistor.

19. The solid-state image capturing device according to claim 18, wherein
the light receiving element comprises a photodiode;
the source and drain of the first transistor are the cathode of the photodiode and a cathode of a first capacitor, respectively,
the source and drain of the second transistor are the charge holding region and the floating diffusion region, respectively,
the floating diffusion region is located at a cathode of a second capacitor, and
the charge holding region is located at the cathode of the first capacitor.

* * * * *